US009028925B2

United States Patent
Shin et al.

(10) Patent No.: US 9,028,925 B2
(45) Date of Patent: May 12, 2015

(54) PRODUCT HAVING FUNCTIONAL LAYER AND METHOD FOR FABRICATING THE SAME

(75) Inventors: Jinhyouk Shin, Changwon-si (KR);
MoonKap Lee, Changwon-si (KR);
Junggeun Oh, Changwon-si (KR);
Jeonggyu Kim, Changwon-si (KR)

(73) Assignee: LG Electronics Inc., Seoul (KR)

( * ) Notice: Subject to any disclaimer, the term of this patent is extended or adjusted under 35 U.S.C. 154(b) by 606 days.

(21) Appl. No.: 13/315,495

(22) Filed: Dec. 9, 2011

(65) Prior Publication Data

US 2012/0145036 A1    Jun. 14, 2012

(30) Foreign Application Priority Data

Dec. 10, 2010    (KR) .................. 10-2010-0126156

(51) Int. Cl.
*C23C 16/00*    (2006.01)
*C09C 1/00*    (2006.01)
*H05H 1/24*    (2006.01)
*C23C 16/40*    (2006.01)

(52) U.S. Cl.
CPC ............. *C23C 16/405* (2013.01); *C23C 16/401* (2013.01)

(58) Field of Classification Search
None
See application file for complete search history.

(56) References Cited

U.S. PATENT DOCUMENTS

| | | | |
|---|---|---|---|
| 7,771,798 B1 | 8/2010 | Grosse et al. | |
| 2008/0063895 A1 | 3/2008 | Jun et al. | |
| 2009/0252893 A1 | 10/2009 | Ozaki et al. | |

FOREIGN PATENT DOCUMENTS

| | | | |
|---|---|---|---|
| CN | 1965103 A | 5/2007 | |
| EP | 2239137 A1 | 10/2010 | |
| JP | 2003-303970 A | 10/2003 | |
| JP | 2005-62595 A | 3/2005 | |
| KR | 2002-0088029 A | 11/2002 | |
| KR | 10-0836055 B1 | 6/2008 | |
| WO | WO 2006/070956 A1 | 7/2006 | |

OTHER PUBLICATIONS

Kurematsu, JP2005062595, Oct. 2005. English machine translation.*
Extended European Search Report for Application No. 11192647.3 dated Mar. 21, 2012.
Office Action for Chinese Application No. 201110416083.9, dated Dec. 10, 2013, including an English translation.

* cited by examiner

*Primary Examiner* — Joseph Miller, Jr.
(74) *Attorney, Agent, or Firm* — Birch, Stewart, Kolasch & Birch, LLP

(57) ABSTRACT

A product having a functional layer and a method for fabricating the same. A method for fabricating a product having a functional layer includes the step of conducting a plasma reaction with titanium and silicon precursor compounds to form a coating on a substrate, such as a heat exchanger surface.

13 Claims, 6 Drawing Sheets

(a)

[ Titanium isopropoxide CTT ]

(b)

[Structural units of Ti precursor]

(a)

(b)

PRODUCT HAVING FUNCTIONAL LAYER AND METHOD FOR FABRICATING THE SAME

CROSS REFERENCE TO RELATED APPLICATION

Pursuant to 35 U.S.C. §119(a), this application claims the benefit of earlier filing date and right of priority to Korean Application No. 10-2010-126156, filed on Dec. 10, 2010, the contents of which are hereby incorporated by reference herein in their entirety.

BACKGROUND OF THE DISCLOSURE

1. Field of the Disclosure

The present invention relates to a product having a functional layer and a method for fabricating the same, and more particularly to, a product having a functional layer with anti-corrosive, hydrophilic and anti-bacteria functions and a method for fabricating the same.

2. Discussion of the Related Art

It has been necessary in various industries, and especially in the HVAC industry, to form and use a layer having a specific function on the surface of a substrate material. Such a functional layer enhances or provides additional properties to the substrate material. For example, a functional layer having anti-corrosion and hydrophilic functions is typically formed on a surface of a heat exchanger, a surface of a side-mirror for a vehicle and the like. A functional layer formed on a heat exchanger for an air conditioner is an embodiment specifically addressed below.

An air conditioner is an electric appliance capable of controlling and providing a predetermined and desired temperature and humidity in a room. An air conditioner is typically designed to use a freezing cycle and the freezing cycle is conducted by employing a compressor, an evaporator, an expansion valve and a condenser. The evaporator and the condenser may be used as a heat-exchanger and each of these components includes a tube configured to allow refrigerant to flow therethrough, with a cooling fin installed in the tube. Heat in the ambient air is exchanged with the refrigerant flowing in the evaporator and the condenser. The evaporator absorbs the heat of the ambient air while the refrigerant is evaporating and the condenser exhausts the heat into ambient air while the refrigerant is condensing.

However, if the surface temperature of the heat exchanger falls below the dew point of the ambient air, condensation occurs and droplets are generated on the surface of the heat exchanger. Under more severe conditions, the droplets freeze and frost is formed. The droplets and/or frost generated on the surface of the heat exchanger might cause several problems. For example, droplets and/or frost would decrease the heat-exchanging area and the heat-exchanging performance of the heat exchanger could deteriorate. In addition, the droplets and frost will require an increase in the power of the fan used for air flow toward the heat exchanger, because droplets and frost are pneumatic-resistant. As a result, it is preferable that droplets are not condensed, and frost is not formed, on the surface of the heat exchanger. In order to address these problems, attempts have been made to enhance the hydrophilicity of the heat exchanger so that droplets condensed on the surface fall away.

In addition to the above a heat exchanger installed in an indoor unit or an outdoor unit may be exposed to outdoor elements. Because of this, corrosion can occur over time. This corrosion may become severe if the heat exchanger is installed in an environment containing much salt, such as near the shore of a salt water body, such as an ocean. As a result, it has been proposed to coat a corrosion-proof material on the surface of the heat exchanger.

In addition, over time fungi, bacteria and the like might inhabit the surface of the heat exchanger and generate an unpleasant odor, as well as cause sanitary problems. Since the heat exchanger is commonly installed in an indoor unit or outdoor unit, it is also not easy to keep the heat exchanger clean. Because of this, it has been proposed to form a coating having anti-bacteria and anti-fungus properties (hereinafter an "anti-bacteria coating") on the surface of the heat exchanger.

To solve the above problems, it has been proposed to coat a functional layer on the surface of the heat exchanger. For example, chrome ($Cr^{+6}$) anti-corrosive treatment is performed on the surface of the heat exchanger to make the surface corrosion-proof and a silicate coating is then formed on the surface to give hydrophilicity properties to the surface. The surface of the heat exchanger may have anti-corrosion and hydrophilicity according to one method. Such a method is typically referred to as the "PCM" method, wherein "PCM" refers to "Pre-Coated Material". However, the PCM method has the disadvantage of 'aging' which deteriorates the hydrophilicity properties gradually, as time passes.

To solve the disadvantage of the PCM method, it has been proposed to coat titanium on the surface of the heat exchanger and one of these methods using titanium is disclosed in Korean Patent Application No. 10-2006-32564. In order to obtain the hydrophilic surface, a titanium coating is formed on the surface of the heat exchanger by using a plasma reaction. Since the evaporation point of titanium is thousands of degrees, it is difficult to use elemental titanium in the plasma reaction. Because of this, a titanium precursor compound that is more easily used in a plasma reaction is employed. Previously, Titanium isopropoxide ($Ti(OC_3H_7)_4$) was used as a titanium precursor. In this case, hexamethyldisiloxane (HMDSO) was coated before the titanium coated layer was formed, resulting in corrosion-proof properties. Thus, titanium isopropoxide was employed as a titanium precursor for plasma deposition in order to achieve hydrophilicity.

Also, in order to obtain anti-bacteria properties, materials known to exhibit anti-bacteria properties, such as copper, cobalt and the like, were used to form precursors for plasma deposition. Consequently, in the conventional art, separate coatings for each of the anti-corrosion, hydrophilicity and anti-bacteria properties were sequentially formed to obtain the final desired layer on the heat exchanger.

SUMMARY OF THE INVENTION

Accordingly, the present invention is directed to a product have a functional layer and a method for fabricating the same.

To solve the problems mentioned above, an object of the present invention is to provide a product having an improved functional layer and a method for fabricating the same.

Another object of the present invention is to provide a product having a functional layer which can be fabricated easily and efficiently, and a method for fabricating the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. It is to be understood by those of ordinary skill in this technological field that other embodiments may be utilized, and structural, electrical as well as procedural changes may be made without departing from the scope of the present invention. Wherever possible, the same reference numbers will be used throughout the drawings to refer to the same or like parts.

In reference to the accompanying drawings, a product having a functional layer according to the present invention and a method for fabricating the product according to an exemplary embodiment of the present invention will be described. As follows, a heat exchanger is described as an example of the products having a functional layer, but the present invention is not limited thereto. The present invention may be applicable to other products.

Figure 1:
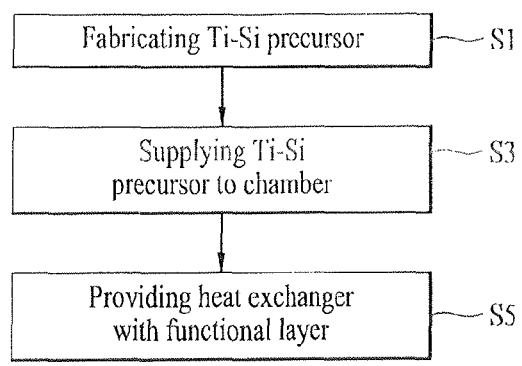
FIG. 1 is a flow chart schematically illustrating a method for fabricating a product having a functional layer according to an exemplary embodiment of the present invention.

First of all, in reference to FIG. 1, a method for fabricating a product having a functional layer according to an exemplary embodiment of the present invention will be described.

Advantageously, and distinct from the conventional art, a functional layer with corrosion-proof, hydrophilicity and anti-bacteria properties may be coated on the surface of a heat exchanger in essentially one step according to an embodiment of the present invention. This embodiment employs precursor compounds capable of forming a layer that exhibits all of the desired corrosion-proof, hydrophilicity and anti-bacteria properties.

As a specific example, precursor compounds capable of forming a corrosion-proof, hydrophilicity and anti-bacteria layer are formed (S1). The precursor compounds are then supplied to a plasma reaction chamber (S3). The precursor compounds supplied to the chamber are used to generate a plasma reaction and a functional layer is formed on the surface of a heat exchanger (S5). In order to generate the plasma reaction in the chamber, a reactive gas must be supplied to the chamber. The reactive gas may be air, oxygen and the like. Liquid precursor compounds may be vaporized into gaseous form in a vaporizer so that gaseous precursor compounds are supplied to the chamber. A carrier gas may be used to enable the gaseous precursor compounds to be supplied smoothly. The carrier gas may be helium, argon and the like. Examples of the plasma reaction conditions, as well as the reactive and carrier gases are described in Korean published patent application no. 10-2006-32564, which is hereby incorporated by reference. These features are similar to the related art and well-known in the art, and detailed description thereof will be omitted accordingly.

Figure 2:
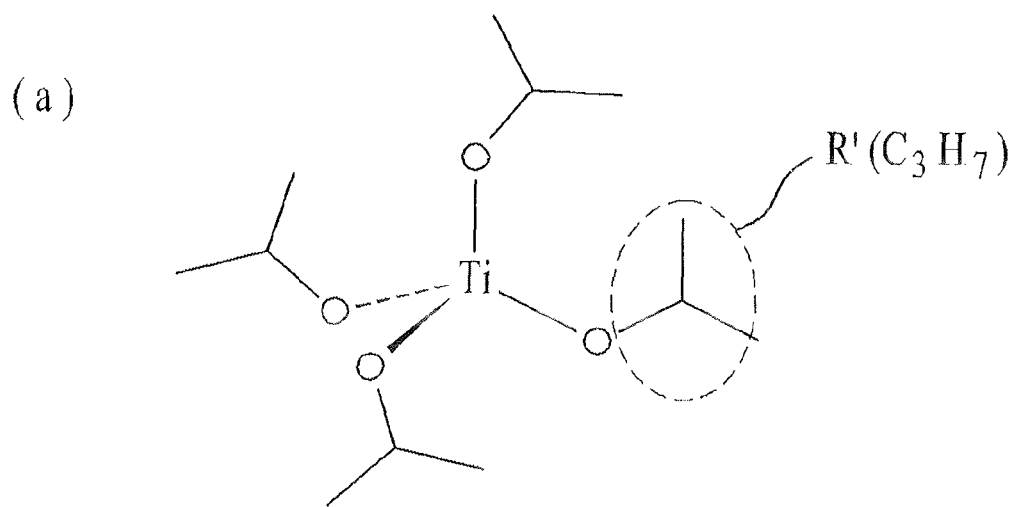
FIG. 2a is a diagram illustrating a structure of a conventional titanium precursor and FIG. 2b is a diagram partially illustrating the structure of the products of a method for making precursor compounds according to an embodiment of the present invention.
Figure 2:
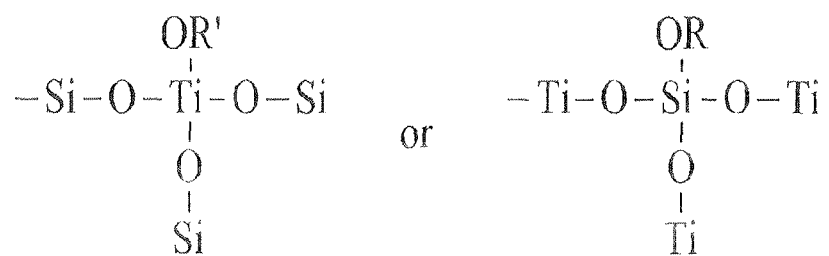

In reference to FIG. 2, the precursor compounds capable of providing the corrosion-proof, hydrophilicity and anti-bacteria properties will be described as follows.

The precursor compounds according to this embodiment may include titanium hydroxide ($Ti(OH)_4$) and silicon hydroxide ($Si(OH)_4$) (hereinafter, the precursor titanium and silicon compounds are referred to as the "Ti—Si precursor compounds"). The surface of the heat exchanger is plasma-coated by using the Ti—Si precursor compounds according to this embodiment so that a corrosion-proof, hydrophilic and anti-bacteria functional layer is formed. It is possible to make the Ti—Si precursor compounds according to this embodiment by using titanium isopropoxide ($Ti(OC_3H_7)$), hereinafter referred to a "TTIP". The structure of TTIP is shown in FIG. 2a.

A process for making the Ti—Si precursor compounds according to this embodiment will be described in detail as follows.

The precursor compounds according to this embodiment are produced from the reaction of titanium isopropoxide, elemental silicon or a silicon alkoxide, and a carboxylic acid (RCOOH wherein "R" is an alkyl group represented by the formula $C_nH_{2n+1}$ with n being in the range of one to three, preferably one. An example of a carboxylic acid is acetic acid, i.e. $CH_3COOH$. The chemical reactions are believed to generally proceed as follows:

$Ti(OC_3H_7)_4+Si$ or $Si(OR)_4+RCOOH \rightarrow Ti(OH)_4+Si(OH)_4+RCOOR'+Ti(OC_3H_7)_4+$Other byproducts   Reaction 1

In other words, titanium isopropoxide is reacted with elemental silicon or silicon alkoxide and carboxylic acid, to generate titanium hydroxide ($Ti(OH)_4$), silicon hydroxide ($Si(OH)_4$) and an ester RCOOR' formed from the starting material compounds including the carboxylic acid and alkyoxy residues of the titanium isopropoxide and silicon alkoxide. Although variable according to reaction conditions, about 30%~40% of the titanium isopropoxide remains unreacted if a catalyst is used and the reaction temperature is set to be about 40° C.~50° C. Preferred catalysts for this reaction include inorganic acids. Basically, $SiO_2$ may be used as a main catalyst. Acryl resin may be added to the main catalyst. Additionally, Ti, Cu and Zn may be added. Due to esterification an ester byproduct RCOOR' is formed. Preferably the ester has a pleasant smell. It is preferable to select an appropriate carboxylic acid for the esterification, so that the ester generated from the reaction exhibits a desired fragrance, or is odorless, along with exhibiting good metal coating properties. The reaction may also produce precursor compounds that have the structures shown in FIG. 2b. That is, alkyl groups of the silicon alkoxide can be replaced with titanium atoms and/or isopropyl groups of the titanium isopropoxide can be replaced with silicon atoms in such precursor compounds.

The titanium hydroxide and silicon hydroxide generated from the above described reactions are substantially involved in the plasma reaction. A layer containing titanium and silicon may be formed on the surface of the heat exchanger, which exhibits corrosion-proof, hydrophilicity and anti-bacteria properties. It is possible to use only the titanium hydroxide and silicon hydroxide as precursor compounds, but it is difficult and costly to separate these compounds from the other products of Reaction 1. Because of this, it is preferable to use all of the products of Reaction 1, including titanium hydroxide, silicon hydroxide, the formed ester, remaining titanium isopropoxide and the other products as precursor compounds. The remaining titanium isopropoxide and the other products may be employed as precursor compounds as the ester is typically not involved in the plasma reaction, and is usually exhausted. It is preferable to reduce the amount of the remaining titanium isopropoxide. To achieve this, the remaining titanium isopropoxide is subjected to a second reaction to reduce the amount thereof. For example, silicon alkoxide and a carboxylic acid can be reacted with the products of Reaction 1 as shown below.

$$Ti(OH)_4 + Si(OH)_4 + RCOOR' + Ti(OC_3H_7)_4 + \text{Other Products of Reaction 1} + Si \text{ or } Si(OR)_4 + RCOOH \rightarrow Ti(OH)_4 + Si(OH)_4 + RCOOR' + Ti(OC_3H_7)_4 + \text{Additional Products} \quad \text{Reaction 2}$$

Employment of a catalyst in Reaction 2, with a reaction temperature of about 30° C.~40° C., reduces the titanium isopropoxide to approximately less than 10% of the original amount. Preferred catalysts for Reaction 2 include inorganic acids. Basically, $SiO_2$ may be used as a main catalyst. Acryl resin may be added to the main catalyst. Additionally, Ti, Cu and Zn may be added.

The chemical reactions occurring in Reaction 2 will now be described.

The basic chemical reaction is: $Ti(OC_3H_7)_4 + 4RCOOH \rightarrow Ti(OH)_4 + RCOOR'$ wherein R' represents an isopropyl group. That is, the ester is formed using the isopropoxy groups from the TTIP, while TTIP is converted into titanium hydroxide. Silicon and silicon alkoxide can react similarly with a carboxylic acid to form a corresponding ester and silicon hydroxide as silicon has reactive properties similar to those of titanium. As a result, various substitution reactions can occur involving $Ti(OH)_4$ and $Si(OH)_4$ as well as substitution reactions involving TTIP, the silicon alkoxide and the carboxylic acid.

The type of silicon that is reacted in Reaction 2 is not limited. Elemental silicon may be used, or a silicon containing compound may be used. For example, a $Si(OR)_4$ type of silicon alkoxide may be used. Preferred silicon alkoxides include $Si(OCH_3)_4$ (tetramethyl orthosilicate), $Si(OC_2H_5)_4$ (tetraethyl orthosilicate), and $Si(OC_3H_7)_4$ (tetrapropyl orthosilicate).

Figure 3:
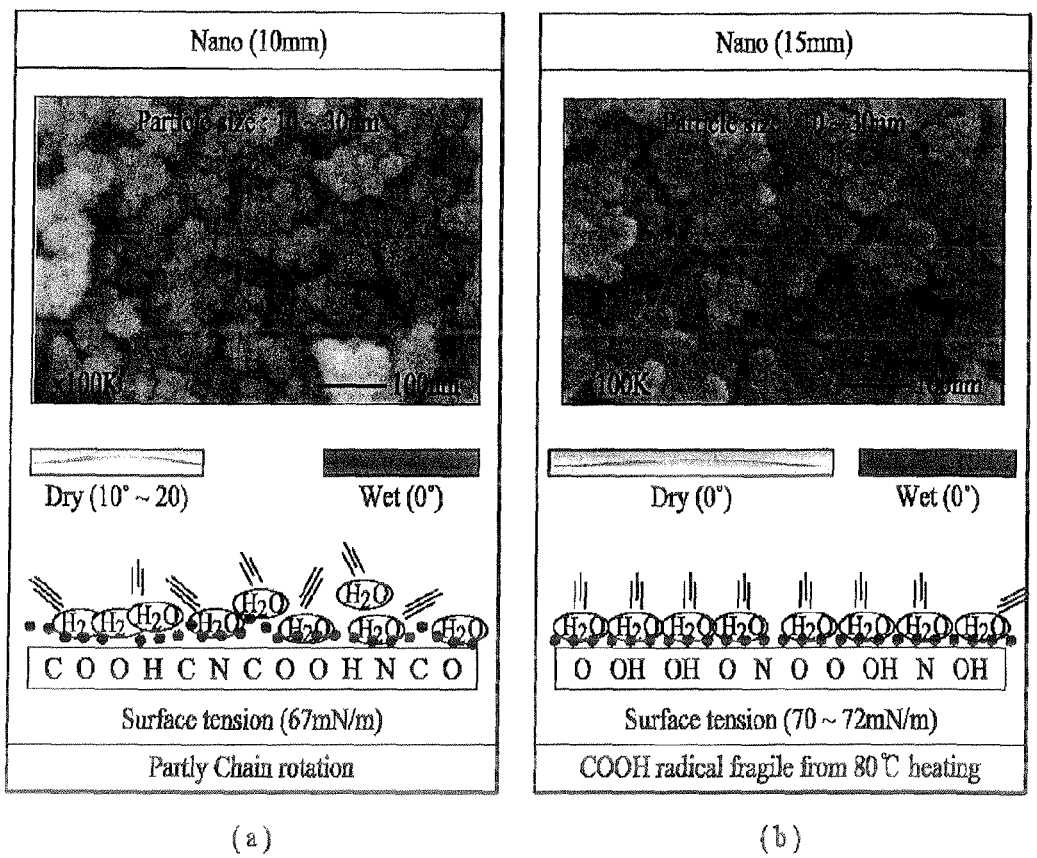
FIG. 3a is a diagram illustrating a surface of a heat exchanger fabricated by using a conventional titanium precursor and FIG. 3b is a diagram illustrating a surface of a heat exchanger fabricated by using the precursor compounds according to an embodiment of the present invention.

In reference to FIG. 3, the function and effects of the heat exchanger fabricated according to the embodiment of the present invention will be described. FIG. 3a is a photograph of the surface of the heat exchanger in the case wherein conventional titanium isopropoxide was used as precursor and FIG. 3b is a photograph of the surface of the heat exchanger in the case wherein a precursor according to an embodiment of the present invention was used.

As shown in FIG. 3a, when the conventional titanium precursor is used, a titanium oxide ($TiO_2$) layer is formed on the surface of the heat exchanger with carboxylic acid (COOH), oxygen, carbon and nitrogen also incorporated into the layer. Here, as shown in FIG. 3b, a titanium-oxide compound, a silicon-oxide compound and the like may be coated on the surface of the heat exchanger according to this embodiment. For example, a layer containing titanium oxide ($TiO_2$) and silicon oxide ($SiO_2$) is formed on the surface of the heat exchanger. Based on the results of observation, it is evident that titanium oxide forms a layer and silicon oxide forms particles. In addition, according to this embodiment, the carboxylic acid breaks down and is incorporated into the layer mainly as hydroxy (—OH), and oxygen radical (—$O_2$) components.

As described above, in case of using the conventional titanium precursor, titanium oxide is mainly employed as a chemical backbone. According to this embodiment, titanium and silicon are incorporated into a layer on the surface of the heat exchanger securely, and serve as a chemical backbone, such that corrosion-proof properties may be improved. The adhesion force for such a layer may be 0.8 kgf or more. A salt spray test is performed to test the corrosion-proof properties. According to the result of the salt spray test, corrosion is generated in 2 and 40 points in one (1) heat exchanger for test in 15 days and 30 days, respectively, after spraying salty water in the cases wherein a conventional titanium precursor is used. Corrosion is generated in 0 and 20 points in one (1) heat exchanger for test in case of using the precursor according to an embodiment of the present invention.

Employment of a conventional titanium precursor results in a surface tension of 67 mN/m and a contact angle of approximately 10 to 20 degrees. On the other hand, an embodiment of the present invention exhibits a surface tension of 70 to 72 mN/m and a contact angle that may be zero degrees. The embodiment of the present invention also results in a droplet size which is advantageously 9 to 12 mm meaning that hydrophilicity properties are significantly improved over conventional products that typically have a smaller droplet size range of less than 7 mm. The improved hydrophilicity is due to an increase in the amount of hydroxyl and oxygen radicals incorporated into the surface of the heat exchanger. In addition, silicon hydroxide appears to be a porous particle which allows water to be easily soaked there into. Because of this property, the hydrophilicity properties may be improved more remarkably.

According to the present invention, the treated surface of the heat exchanger exhibits antibiosis (anti-bacteria) properties that may result from the porous structure of silicon hydroxide. A silicon hydroxide particle has nano-sized air pores such that the specific surface area of the layer may be increased. Specifically, fungi or bacteria and the like are adhered to the air pores of the silicon hydroxide particles and, because of the small size of the pores, nutrients are prevented from being provided the fungi or bacteria. This results in the cell wall of the bacteria breaking.

Figure 4:
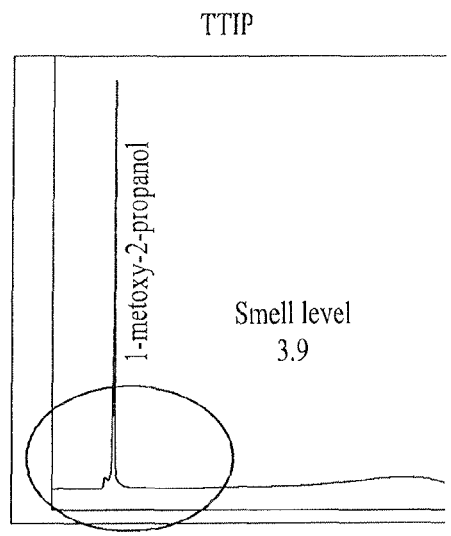
FIG. 4a is a graph illustrating a smell level of the surface of the heat exchanger fabricated by using the conventional titanium precursor and FIG. 4b is a graph illustrating a smell level of the surface of the heat exchanger fabricated by using the titanium precursor according to the embodiment of the present invention.
Figure 4:
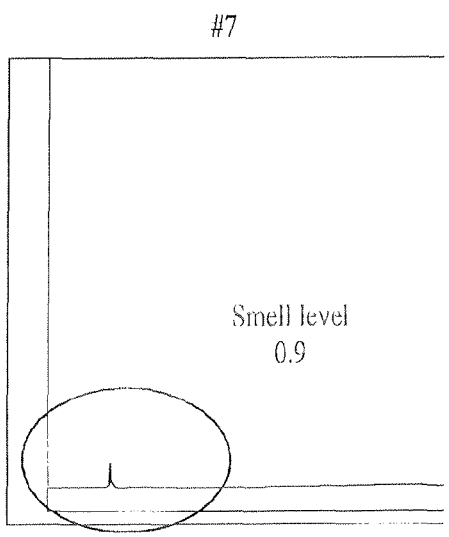

If the conventional titanium precursor of titanium isopropoxide is used without any silicon compounds, an unpleasant smell might be generated in the heat exchanger disadvantageously. This is because the titanium isopropoxide includes an isopropyl group ($C_3H_7$). Titanium isopropoxide that does not react in the plasma reaction chamber adheres to the surface of the heat exchanger and cannot be eliminated completely even if the surface is washed with water or air. The unreacted titanium isopropoxide causes an unpleasant smell to occur. However, according to the present invention, only a very small amount of titanium isopropoxide is supplied to the plasma reaction chamber such that little titanium isopropoxide adheres to the surface of the heat exchanger. As a result, there is little unpleasant smell. As shown in FIG. 4, the unpleasant smell level is 3.9 in the case of the conventional process, while the smell level is lowered to 0.9 in the embodiment of the present invention. Compared with the conventional process, the present invention may remove 80 to 90% of the unpleasant smell. This is because approximately less than 10% of the TTIP remains after performing the two reactions described above in accordance with the present invention, as compared with 100% of the TTIP remaining according to the related art.

As described above, the corrosion-proof, hydrophilic and anti-bacteria functional layer may be formed on the surface of a heat exchanger in a single process, using the Ti—Si precursor compounds according to embodiments of the present invention. In addition, unpleasant odors generated by coating a heat exchanger according to conventional methods may be reduced remarkably according to the method of the present invention.

A product having a functional layer and a method for fabricating the same according to another embodiment of the present invention will be described as follows.

In this embodiment, the Ti—Si precursor includes an anti-bacteria component to improve the anti-bacteria properties. As an example, compounds generated from the following reaction may be used:

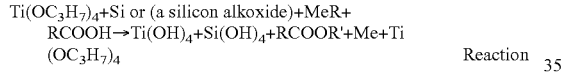

Reaction wherein "Me" refers to a metallic anti-bacteria component such as zinc, copper or silver, hereinafter referred to as an "anti-bacteria metal compound". The variable "R" refers to an alkyl group which is preferably selected from $C_nH_{2n+1}$ with "n" being in the range of 1-3, preferably one.

If the above chemical reaction is used, the anti-bacteria metal may be employed in its elemental form or preferably employed as a compound containing an alkyl group, i.e. MeR wherein "R" is defined immediately above.

The anti-bacteria metal compound MeR is preferably used as a starting material for generation of the Ti—Si precursor compounds before being supplied to the plasma reaction chamber for the plasma reaction. However, it is possible to supply the anti-bacteria metal compound directly to the plasma reaction chamber without first being used as a starting material.

Figure 5:
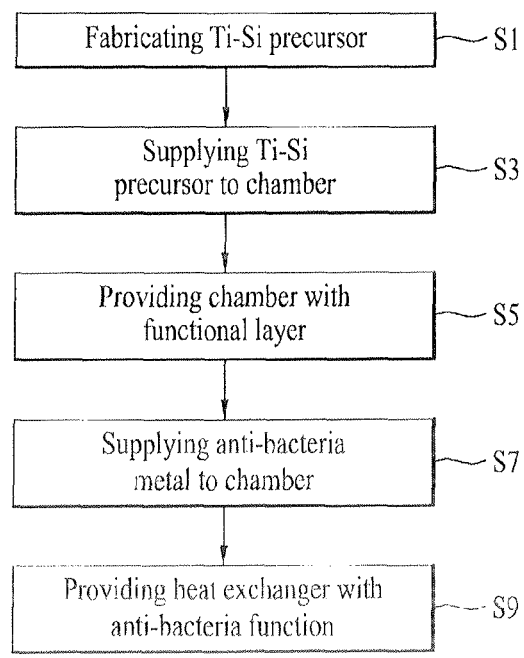
FIG. 5 is a flow chart schematically illustrating a method for fabricating a product having a functional layer according to another embodiment of the present invention.

In reference to FIG. 5, the heat exchanger according to the present invention and a method for fabricating the heat exchanger according to another embodiment will be described.

Figure 6:
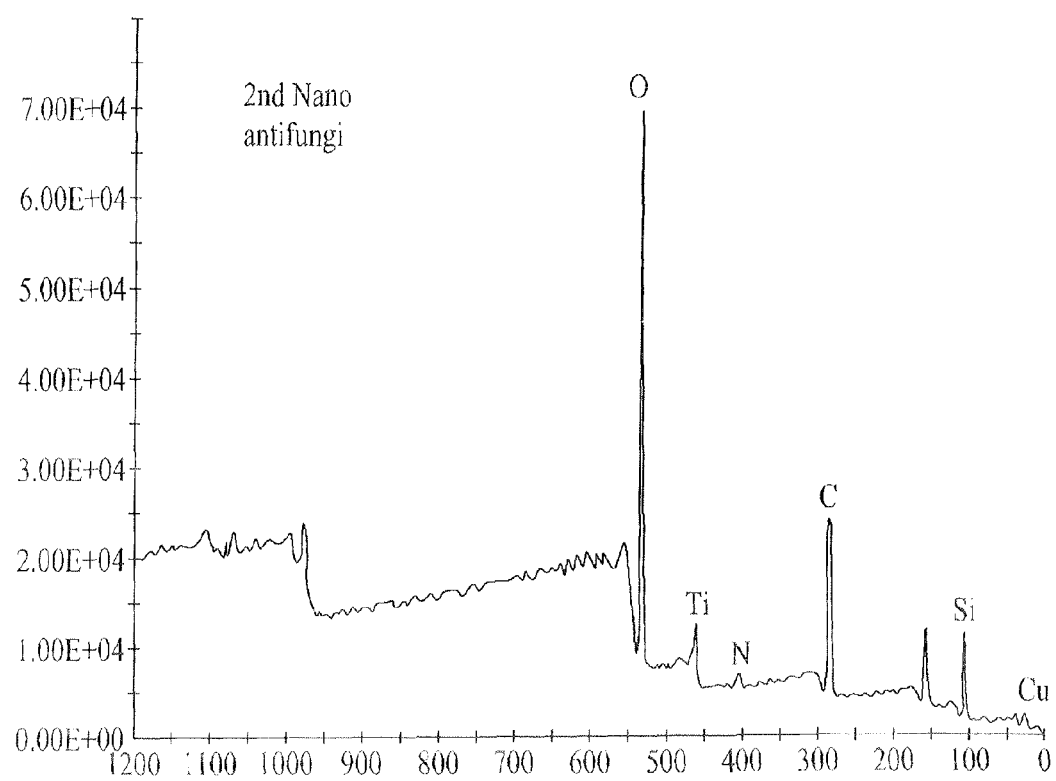
FIG. 6 is a graph analyzing surface elements of the heat exchanger of FIG. 4.

The basic principle of this embodiment is similar to the basic principle of the above embodiment, with a goal of further enhancing the anti-bacteria properties. First, a functional layer is formed by using the Ti—Si precursor compounds (S1, S3 and S5) but without the anti-bacteria metal compound. After that, the anti-bacteria metal compound is supplied to the plasma chamber (S7) and coated on the heat exchanger (S9). It is preferable that at least one of zinc, copper or silver is used to form the anti-bacteria metal compound. FIG. 6 is an X-ray photoelectron spectroscopic graph of the surface of the coated heat exchanger, wherein a copper compound is used to coat the surface of the heat exchanger after coating the surface with Ti—Si precursor compounds. As shown in FIG. 6, the oxygen component content is the largest among the titanium, silicon, and copper components in the coating. The coated layer of the heat exchanger includes 15.5% carbon, 64.9% oxygen, 8% silicon, 8.7% titanium and 0.7% copper according to the measured atomic percentages. Although the conditions of the plasma reaction can be varied to change the concentrations of the elements in the produced coating, preferred concentrations in the produced coating layer include atomic percentages of 15~25% for the total amount of silicon and titanium, and 0.5~1.5% for the amount of copper.

In addition, as a result of an experiment conducted using KITASATO Environmental Certificate standards, it was observed that in the absence of the functional layer of the present invention $3.8 \times 10^5$ bacteria were detected after 24 hours, whereas in contrast, less than 10 bacteria were detected after the functional layer was formed.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a product having a functional layer comprising the steps of:
conducting a plasma reaction on a substrate, wherein precursor compounds are supplied for the plasma reaction; wherein the precursor compounds are selected from the group consisting of: (1) titanium isopropoxide and/or titanium hydroxide, (2) silicon alkoxide, elemental silicon and/or silicon hydroxide, and (3) a carboxylic acid RCOOH with R being represented by the formula $C_nH_{2n+1}$ and n being in the range of 1 to 3; and wherein the plasma reaction forms a functional layer on the substrate comprising titanium and silicon as components thereof,
wherein a number of esterification reactions is determined for the amount of remaining titanium isopropoxide to be less than 10% by mass, and
wherein the substrate is a surface of a heat exchanger.

2. The method for fabricating the product having the functional layer of claim 1, wherein the precursor compounds comprise titanium hydroxide (Ti(OH)$_4$) and silicon hydroxide (Si(OH)$_4$).

3. The method for fabricating the product having the functional layer of claim 2, wherein the precursor compounds are formed by reaction of titanium isopropoxide, elemental silicon or silicon alkoxide and a carboxylic acid (RCOOH).

4. The method for fabricating the product having the functional layer of claim 3, wherein the carboxylic acid is acetic acid.

5. The method for fabricating the product having the functional layer of claim 2, wherein the precursor is formed by an esterification reaction involving a carboxylic acid and titanium isopropoxide and/or silicon alkoxide.

6. The method for fabricating the product having the functional layer of claim 5, wherein the carboxylic acid is a compound of the formula RCOOH, with R being $C_nH_{2n+1}$ and n being in the range of 1 to 3, and wherein the carboxylic acid is esterified to form an ester having a fragrance.

7. The method for fabricating the product having the functional layer of claim 1 or 2, further comprising:
coating an anti-bacteria metal selected from zinc, copper and silver on the substrate.

8. The method for fabricating the product having the functional layer of claim 1 or 2, wherein the precursor compounds further comprise anti-bacteria metal compounds of the formula MeR, wherein Me is a metal selected from the group consisting of zinc, copper and silver, and R is an alkyl group of the formula $C_nH_{2n+1}$ with n being in the range of 1 to 3.

9. The method for fabricating the product having the functional layer of claim 8, wherein the precursor compounds are formed by a reaction of titanium isopropoxide, silicon, an anti-bacteria metal compound of the formula MeR with Me selected from the group consisting of zinc, copper and silver, and R being an alkyl group of the formula $C_nH_{2n+1}$ with n being in the range of 1 to 3, and a carboxylic acid RCOOH wherein R is represented by the formula $C_nH_{2n+1}$ with n being in the range of 1 to 3.

10. A method for fabricating a product having a functional layer comprising:
   a first step of reacting titanium isopropoxide, silicon and carboxylic acid of the formula RCOOH with each other, wherein R is an alkyl group of the formula CnH2n+1 with n being in the range of 1 to 3,
   wherein the number of reactions is determined for the amount of remaining titanium isopropoxide to be less than 10% by mass.

11. The method for fabricating the product having the functional layer of claim 10, further comprising:
   a second step of reacting the carboxylic acid with compounds generated in the first step.

12. The method for fabricating the product having the functional layer of claim 10 or 11, wherein the carboxylic acid is acetic acid.

13. A method for fabricating a product having a functional layer comprising the steps of:
   conducting a plasma reaction on a substrate, wherein precursor compounds are supplied for the plasma reaction; wherein the precursor compounds are selected from the group consisting of: (1) titanium isopropoxide and/or titanium hydroxide, (2) silicon alkoxide, elemental silicon and/or silicon hydroxide, and (3) a carboxylic acid RCOOH with R being represented by the formula $C_nH_{2n+1}$ and n being in the range of 1 to 3; and wherein the plasma reaction forms a functional layer on the substrate comprising titanium and silicon as components thereof,
   wherein the precursor compounds further comprise anti-bacteria metal compounds of the formula MeR, wherein Me is a metal selected from the group consisting of zinc, copper and silver, and R is an alkyl group of the formula $C_nH_{2n+1}$ with n being in the range of 1 to 3, and
   wherein the precursor compounds are formed by a reaction of titanium isopropoxide, silicon, an anti-bacteria metal compound of the formula MeR with Me selected from the group consisting of zinc, copper and silver, and R being an alkyl group of the formula $C_nH_{2n+1}$ with n being in the range of 1 to 3, and a carboxylic acid RCOOH wherein R is represented by the formula $C_nH_{2n+1}$ with n being in the range of 1 to 3.

* * * * *